Aug. 22, 1967 N. G. MUSKOVAC 3,337,753

PULSE FORMING GATE CIRCUIT

Filed Dec. 30, 1965

INVENTOR
Nicholas G. Muskovac
BY Connolly and Hutz
ATTORNEYS

United States Patent Office 3,337,753
Patented Aug. 22, 1967

3,337,753
PULSE FORMING GATE CIRCUIT

Nicholas G. Muskovac, Williamstown, Mass., assignor to Sprague Electric Company, North Adams, Mass., a corporation of Massachusetts Filed Dec. 30, 1965, Ser. No. 517,680
5 Claims. (Cl. 307—88.5)

ABSTRACT OF THE DISCLOSURE

The circuit employs of low power SCR to fire a high power SCR and includes a wave forming means which produces a positive anode-to-cathode bias of substantially constant magnitude on the low power SCR during a half-cycle of applied alternating current and a low negative gate-to-cathode bias on the high power SCR such that upon triggering of the low power SCR, its pulse, which is of substantially constant magnitude, overcomes the negative gate bias, thereby producing a firing pulse having a fast rise time for the high power SCR.

This invention relates to electrical circuits in general and to gate circuits for firing silicon controlled rectifiers in particular.

A silicon controlled rectifier, hereinafter referred to as "SCR," is a three terminal device which conducts only when both the gate and the anode are positive with respect to the cathode. This characteristic permits the rectification and control of large amounts of A.C. power in response to the pulsing of the rectifier gate. Various gate circuits capable of firing this device are available in the prior art, however, these generally provide low voltage and low current gate pulses which are unsuitable for high power silicon controlled rectifiers.

It is an object of this invention to provide a novel gate circuit which produces a fast rise time, high voltage and high current pulse of variable phase and constant amplitude for firing of high power silicon controlled rectifiers.

It is another object of this invention to provide a circuit arrangement which produces both a positive fast rise gate pulse and a small constant negative gate bias for high power silicon controlled rectifiers.

It is a still further object of this invention to provide a gate circuit which employs low power silicon controlled rectifiers with a novel voltage divider network.

These and other objects of the invention will be apparent from a consideration of the following description taken in conjunction with the drawing in which.

In general, a gate pulse forming circuit produced in accordance with this invention comprises a low power SCR in connection to wave forming means producing a negative anode-to-cathode bias during a first half-cycle of applied alternating voltage and a positive anode-to-cathode bias of substantially constant amplitude during the second half-cycle, said wave forming means including a negative bias means providing a negative gate bias, and trigger means for firing said low power SCR during said second half-cycle to produce a fast rise gate pulse.

In a more limited sense, a gate circuit produced in accordance with this invention comprises a low power SCR, a pair of diodes in parallel anodic connection to one side of an alternating current source and in cathodic connection to the cathode and anode respectively of said low power SCR, a resistor means connecting said cathode to the other side of said source, and a charging capacitor connecting said anode to said other side. A negative bias means is provided by a current limiting resistor connecting said charging capacitor to the gate of a high power SCR, and a bleeder resistor by-passing said charging capacitor and said current limiting resistor.

In accordance with the invention, a pulse forming circuit for firing of two high power SCR's comprises two low power SCR's, each having a separate trigger and wave forming means. The means of one low power rectifier being phased 180° from those of the other, such that each rectifier is alternately fired to produce gate pulses having a 180° phase difference.

Figure 1:
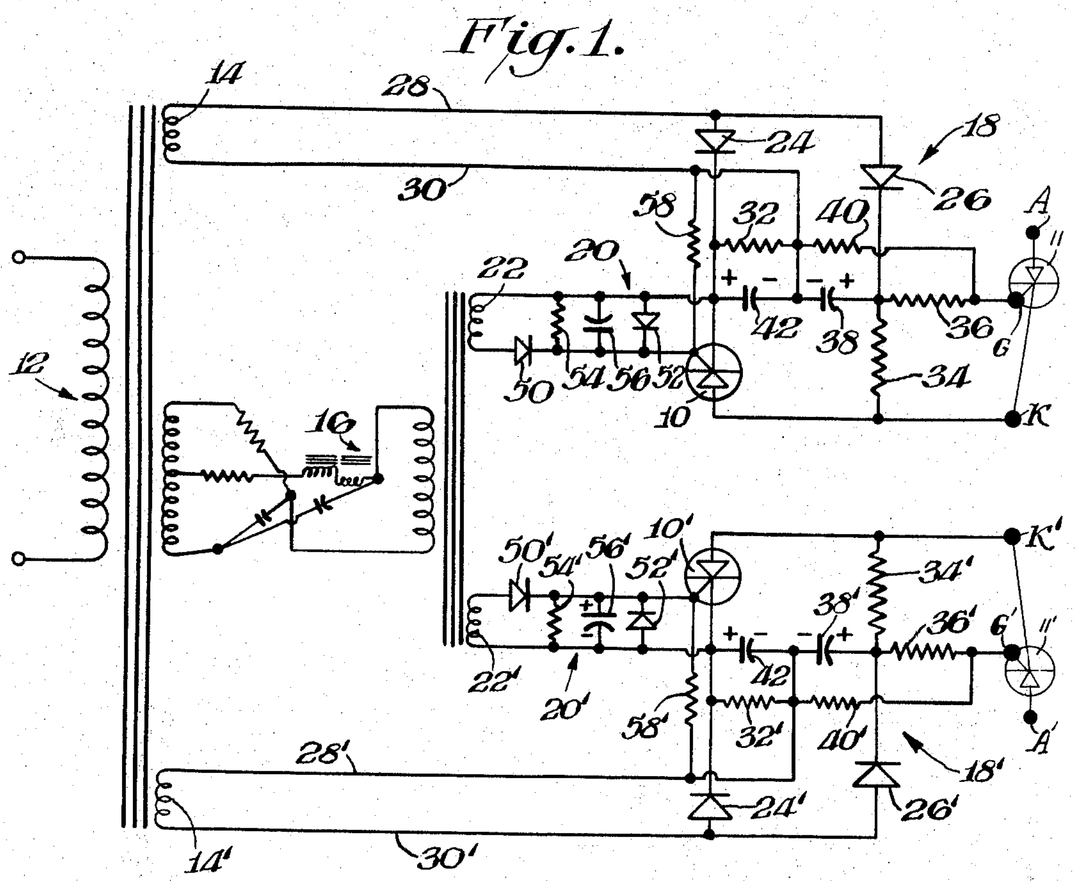
FIGURE 1 is a schematic diagram of a pulse forming circuit providing means for full wave firing of high power silicon controlled rectifiers.

Referring now to the drawing and FIGURE 1 in particular wherein two low power SCR's 10, 10' are shown in a circuit for full wave control of a pair of high power silicon controlled rectifiers 11 and 11'. Each SCR 10, 10' is connected to an alternating current source 12 with one phased 180° from the other. Thus, rectifiers 10, 10' are coupled to source 12 through transformer windings 14, 14' and a phase shifter 16. A novel voltage divider circuit or wave forming means 18, 18' of each is connected to windings 14, 14' whereas a trigger circuit 20, 20' of each is coupled to phase shifter 16 by transformer windings 22, 22'.

Each low power rectifier 10, 10' is fired, in a 180° phase relation, once per cycle of applied alternating voltage to produce a fast rise time gate pulse at their output terminals G, K and G', K'. The terminal notation G, K indicates connection to the grid and cathode respectively of a high power SCR, and terminal notation A indicates conventional anode connection. The time of occurence of the gate pulse, with respect to the alternating cycle, is varied by means of the phase shifter 16 which controls the phase of the trigger or firing pulse of rectifiers 10, 10'. In the preferred embodiment a phase shifter as described in Patent No. 2,524,761 issued on Oct. 10, 1950, to W. J. Brown is employed, although any suitable means of varying the trigger phase is acceptable.

Since the circuits of each rectifier 10, 10' are identical except for the 180° phase difference, the description herein is generally confined to one; with the understanding that such also applies to the other when full wave operation is desired.

The wave forming circuit 18 not only provides a negative anode-to-cathode bias for SCR 10 during a first half-cycle of applied alternating voltage and a positive anode-to-cathode bias of substantially constant amplitude during the second half-cycle, but also provides a negative bias means which produces a negative gate potential on terminal G with respect to terminal K.

In the preferred embodiment, rectifier 10 is a low power SCR such as C6–F, or the like, and wave forming means 18 consists of diodes 24, 26 such as D9906, or the like, connected in parallel to one side 28 of transformer winding 14, and to the cathode and anode respectively of rectifier 10. The anode of each diode 24, 26 is connected to side 28. The cathode of diode 24 is connected to the cathode of rectifier 10, trigger circuit 20 and the other side of the line 30 through a 50-ohm resistor means 32. The cathode of diode 26, on the other hand, is connected to the anode of rectifier 10 by a 100-ohm load resistor 34, to terminal G by an 8.2-ohm current limiting resistor 36 and to the other side 30 of the line by a 200-microfarad charging capacitor 38. The wave forming means is completed by a 150 ohm bleeder resistor 40 which connects side 30 of the line to terminal G.

Figure 2:
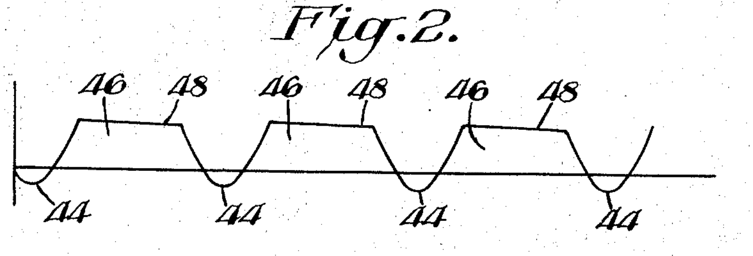
FIGURE 2 is a chart of the pulsating anode potential of each low power controlled rectifier of FIGURE 1.

Current will flow through both diodes 24, 26 during a first half-cycle of applied voltage with the current through diode 24 and resistor 32 bucking that through diode 26 and capacitor 38, to form the pulsating voltage shown in FIGURE 2. While current flows through diodes 24, 26, the cathode-to-anode assumes a negative potential 44 and as current ceases to flow, the potential rises to the positive charge 46 of capacitor 38. Capacitor 42, which bypasses resistor 32, and is employed as a low impedance means to shunt the output pulse of rectifier 10 past resistor 32, does not effect the wave forming means, since it is small in comparison to capacitor 38 and does not retain a charge.

The substantially constant voltage 46, illustrated in FIGURE 2, is due to the retained charge of capacitor 38 during the second half-cycle of applied alternating current; the slight loss 48 in voltage during this half-cycle being provided by the capacitor 38 by-pass loop, formed by bleeder resistor 40 and current limiting resistor 36. This bleed of capacitor 38 results in the aforementioned slight drop of voltage 48 which insures a negative swing 44 during the following half-cycle. It should be noted that resistors 36, 40 also provide a negative bias means, described more fully in a latter portion of the specification, for the gate of the high power SCR.

SCR 10 is fired, during the second half-cycle by trigger circuit 20 which comprises both a pulse forming circuit and a clamping means. Trigger 20 is connected across the cathode and gate of rectifier 10, as shown, to provide a positive gate or trigger pulse thereon. This branch 20 comprises a pair of diodes 50, 52, such as D9906, a 3.9-kilohm load resistor 54, a 2.2-microfarad capacitor 56 and a 3.9 kilohm clamping resistor 58, all in connection to transformer winding 22. One side of winding 22 is serially connected through diode 50 to the gate whereas the other side is connected to the cathode of SCR 10. Resistor 54, capacitor 56 and diode 52 are connected in parallel across the gate and cathode. Diode 50 is arranged to allow current flow from transformer winding 22 to the gate whereas diode 52 is arranged to conduct from cathode to gate thereby limiting the voltage in this direction.

Since it is desirable to trigger or bias the gate of rectifier 10 positive, only when a positive anode-to-cathode potential 42 is present, a clamping means is provided by the circuit loop through diode 24, diode 52 and resistor 58. Thus, during the first half-cycle, current flows through diode 24 not only to wave forming means 18 but also through diodes 52 and clamping resistor 58 to provide a negative gate-to-cathode bias on rectifier 10 during this half-cycle.

Once diode 24 ceases to conduct, during the second half-cycle, the trigger circuit 20 is no longer clamped off and thus can provide a positive gate bias, on rectifier 10, in response to a voltage induced in transformer winding 22. Thus, depending upon the phase position of phase shifter 16, a rectified positive voltage is provided across resistor 54 and capacitor 56 to cause a positive gate-to-cathode bias or firing pulse on SCR 10.

Since the phase of the induced voltage of transformer winding 22 may be varied by phase shifting 16 throughout 180°, the trigger pulse may be varied throughout the second half-cycle of applied alternating voltage, and rectifier 10 subsequently fired at any time during this half-cycle.

Figure 3:
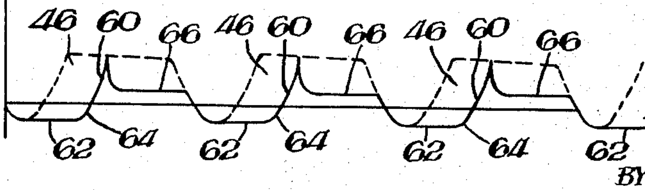
FIGURE 3 is a chart of the output pulse of the gate circuit superimposed on the anode potential of FIGURE 2.

A positive pulse having fast rise time 60, as shown in FIGURE 3, is obtained at terminals G–K since the pulse of rectifier 10 is made to overcome a negative bias of these terminals. The latter is provided by a negative bias means or voltage divider network comprising resistors 36 and 40 which produce a negative voltage 62 on terminal G with respect to terminal K. This bias holds the gate of high power SCR 11 negative and improves the rise time of its gate pulse since, as shown in FIGURE 3, the slow initial portion 64 of the output pulse of rectifier 10, commonly called the "delay time," is dissipated in overcoming the negative bias 62, such that the remaining positive portion 60 of the pulse across G–K has a fast rise time. Thus, resistors 36, 40 not only provide a slight decrease in plate voltage 48, to insure the negative cutoff bias 44 of rectifier 10, but also provide a negative bias means for high power SCR 11, as indicated.

The low impedance means, as 1 microfarad capacitor 42, is provided in parallel to resistor means 32 to pass the fast rise pulse. This permits the pulse of rectifier 10 to pass through capacitor 42 and 38, and be formed across load resistor 34, where it is taken off at terminals G, K. Terminal G is connected through resistor 36 to the cathode side and terminal K is connected directly to the anode side of load resistor 34. Resistor 36 acts as a current limiting resistor for the gate pulse and together with resistor 40, as shown in FIGURE 3, provides the current limited portion 66 of the pulse.

Accordingly, a fast rise pulse of 10 volts and 1.5 amps peak is obtained at G-K for every other half-cycle of applied alternating voltage, and although the pulse may be varied in phase with respect to initiation of the half-cycle it will have a substantially constant amplitude, since the anode potential is substantially constant during this half-cycle. A slight change in the gate pulse amplitude does, of course, result from the slight decrease 48 in anode potential. This decrease 48 of potential is provided as indicated earlier, so as to insure a negative bias 44 during the next half-cycle and thus, cut off SCR 10. If capacitor 38 were not bled slightly by resistors 40 and 36, the anode-to-cathode voltage would fall, at best, only to zero rather than negative 44 during the first half-cycle. Accordingly, under such conditions, SCR 10 would not always be cut off.

Furthermore, as indicated, a syncronous gate pulse every half-cycle may be obtained for full wave firing of high power SCR's 11, 11' by the use of two low power SCR's 10, 10' having identical circuitry, as described, but with one phased 180° from the other.

Although a preferred embodiment has been illustrated and described herein it should be understood that many different embodiments may be made without departing from the spirit and scope thereof and that the invention is not to be limited except as defined in the appended claims.

What is claimed is:

1. A pulse forming gate circuit for firing a high power silicon controlled rectifier comprising: a low power silicon controlled rectifier; a wave forming means producing negative anode-to-cathode bias on said low power rectifier during the first half-cycle and positive anode-to-cathode bias of substantially constant amplitude during the second half-cycle of applied alternating voltage, and said wave forming means producing a negative gate-to-cathode bias on said high power rectifier; trigger means producing a firing pulse of variable phase on said low power rectifier during said second half-cycle thereby triggering said low power rectifier and producing at its output a pulse of substantially constant amplitude; and a low impedance means connecting said output to the gate of said high output rectifier, said low impedance means forming said pulse across the gate and cathode of said high power rectifier to overcome the negative bias thereof and produce a fast rise time pulse for firing said high power rectifier.

2. A gate circuit as claimed in claim 6 including a clamping means producing a negative gate bias on said low power rectifier during said first half-cycle.

3. A gate circuit as claimed in claim 6 wherein said wave forming means comprises a pair of diodes in parallel anodic connection to one side of an alternating current source, a first of said diodes in cathodic connection to the cathode of said lowe power rectifier and the other of said diodes in cathodic connection to the anode of said low power rectifier, a resistor means connecting said cathode to the other side of said source, a charging capacitor connecting said anode to said other side, a current limiting resistor connecting said charging capacitor to the gate of said high power rectifier, and a bleeder resistor by-passing said charging capacitor and said current limiting resistor.

4. A gate circuit as claimed in claim 3 wherein said low impedance means is a capacitor by-passing said resistor means.

5. A gate circuit as claimed in claim 4 including a second low power silicon controlled rectifier, a second wave forming means, and a second trigger means, said second means all being connected to said second low power rectifier in 180° phase relation to the first means to produce a gate pulse from said second low power rectifier in 180° phase relation to said first gate pulse.

References Cited

UNITED STATES PATENTS

| | | | |
|---|---|---|---|
| 3,088,075 | 4/1963 | Pintell | 307—88.5 X |
| 3,119,058 | 1/1964 | Genuit | 307—88.5 |
| 3,243,711 | 3/1966 | King et al. | 307—88.5 |

OTHER REFERENCES

Solid State Products Bulletin, Inc., pp. 16 and 17 relied on.

ARTHUR GAUSS, *Primary Examiner.*

J. S. HEYMAN, *Examiner.*

UNITED STATES PATENT OFFICE

CERTIFICATE OF CORRECTION

Patent No. 3,337,753 August 22, 1967

Nicholas G. Muskovac

It is hereby certified that error appears in the above numbered patent requiring correction and that the said Letters Patent should read as corrected below.

Column 3, line 58, for "shifting" read -- shifter --; column 4, line 5, for "as" read -- a --; lines 63 and 66, for the claim reference numerals "6", each occurrence, read -- 1 --.

Signed and sealed this 15th day of October 1968.

(SEAL)
Attest:

Edward M. Fletcher, Jr.
Attesting Officer

EDWARD J. BRENNER
Commissioner of Patents